United States Patent
Kim et al.

(10) Patent No.: US 9,275,595 B2
(45) Date of Patent: Mar. 1, 2016

(54) OUTPUT BUFFER CIRCUIT AND SOURCE DRIVING CIRCUIT INCLUDING THE SAME

(71) Applicant: Samsung Electronics Co., Ltd., Suwon-si, Gyeonggi-do (KR)

(72) Inventors: Jin-Han Kim, Suwon-si (KR); Jae-Wook Kwon, Hwaseong-si (KR); Seong-Jong Yoo, Seongnam-si (KR); Ha-Jun Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 46 days.

(21) Appl. No.: 14/185,445

(22) Filed: Feb. 20, 2014

(65) Prior Publication Data
US 2014/0253534 A1    Sep. 11, 2014

(30) Foreign Application Priority Data
Mar. 5, 2013 (KR) .......................... 10-2013-0023462

(51) Int. Cl.
| | |
|---|---|
| G09G 3/26 | (2006.01) |
| G09G 3/36 | (2006.01) |
| H03K 5/04 | (2006.01) |
| H03K 19/003 | (2006.01) |

(52) U.S. Cl.
CPC ............ *G09G 3/3685* (2013.01); *G09G 3/3688* (2013.01); *H03K 5/04* (2013.01); *H03K 19/00361* (2013.01); *G09G 2310/027* (2013.01); *G09G 2310/0291* (2013.01)

(58) Field of Classification Search
CPC .............. G09G 3/3685; G09G 3/3688; G09G 2310/0291; G09G 2310/027; H03K 5/04; H03K 19/00361
See application file for complete search history.

(56) References Cited

U.S. PATENT DOCUMENTS

| | | | |
|---|---|---|---|
| 7,317,440 B2 | 1/2008 | Chung | |
| 7,760,199 B2 | 7/2010 | An | |
| 8,018,282 B2 | 9/2011 | Liang et al. | |
| 2004/0036670 A1* | 2/2004 | Chung | .......................... 345/99 |
| 2008/0164945 A1* | 7/2008 | Yang | ............................ 330/253 |
| 2008/0266276 A1* | 10/2008 | Choi et al. | ..................... 345/204 |
| 2010/0231577 A1 | 9/2010 | Kim et al. | |
| 2012/0013378 A1 | 1/2012 | Kim et al. | |
| 2012/0019502 A1 | 1/2012 | Kawagochi | |
| 2012/0133631 A1 | 5/2012 | Lim et al. | |
| 2012/0146720 A1 | 6/2012 | Hsu et al. | |
| 2012/0161866 A1 | 6/2012 | Hung et al. | |
| 2013/0286002 A1* | 10/2013 | Huang | .......................... 345/213 |

FOREIGN PATENT DOCUMENTS

| | | |
|---|---|---|
| JP | 2012-134947 | 7/2012 |
| KR | 10-2007-0058780 A | 6/2007 |
| KR | 10-2008-0003033 A | 1/2008 |

* cited by examiner

*Primary Examiner* — Liliana Cerullo
(74) *Attorney, Agent, or Firm* — Lee & Morse, P.C.

(57) ABSTRACT

A source driving circuit includes an output buffer circuit to compensate for slew rate of signals used to drive a display device. The output buffer circuit includes a bias current control signal generating circuit and a channel amplifying circuit. The bias current control signal generating circuit performs an exclusive OR operation on an input signal and an output signal of a reference operational amplifier to generate a bias current control signal. The channel amplifying circuit adjusts the slew rate of a plurality of output voltage signals in response to the bias current control signal. The output signals are then used to control the display device.

25 Claims, 15 Drawing Sheets

OUTPUT BUFFER CIRCUIT AND SOURCE DRIVING CIRCUIT INCLUDING THE SAME

CROSS-REFERENCE TO RELATED APPLICATION

Korean Patent Application No. 10-2013-0023462, filed on Mar. 5, 2013, and entitled, "Output Buffer Circuit and Source Driving Circuit Including the Same," is incorporated by reference herein in its entirety.

BACKGROUND

1. Field

One or more embodiments described herein relate to a display device.

2. Description of Related Art

Flat panel devices are widely used as display devices. Each flat panel device generally includes a display panel, a control unit, a gate driver, and a source driver. The source driver drives the data lines of the display panel using voltages corresponding to data signals received from the control unit. In one type of device, the source driver receives a plurality of gray voltages output from a gray voltage generating unit, and selects one of the plurality of gray voltages to drive the data line.

SUMMARY

In accordance with one embodiment, an output buffer circuit includes a bias current control signal generating circuit including a reference operational amplifier, the bias current control signal generating circuit configured to perform an exclusive OR operation on an input signal and an output signal of the reference operational amplifier to generate a bias current control signal; and a channel amplifying circuit configured to adjust a slew rate of a plurality of output voltage signals in response to the bias current control signal, the channel amplifying circuit configured to perform buffering on a plurality of input voltage signals to generate the plurality of output voltage signals.

The output buffer circuit may be configured to further adjust the slew rate of the plurality of output voltage signals in response to a gray code of a source driving circuit of a display device. A magnitude of a tail current of the plurality of output voltage signals may be configured to be adjusted according to a combination of bits of the gray code. The slew rate may increases with an increase in the tail current.

The bias current control signal generating circuit may include an XOR circuit that performs the exclusive OR operation on the input signal and the output signal of the reference operational amplifier to generate the bias current control signal. The bias current control signal may be configured to be activated during a transition period, in which the output signal of the reference operational amplifier changes from a minimum value to half of a maximum value. Also, the bias current control signal may be configured to be activated during a transition period, in which the output signal of the reference operational amplifier changes from a ground voltage to half of a supply voltage.

The bias current control signal generating circuit may include a first reference operational amplifier configured to buffer a first reference input signal to generate a first reference output signal; a first XOR circuit configured to perform the exclusive OR operation on the first reference input signal and the first reference output signal; an inverter configured to invert a phase of the first reference input signal; a second reference operational amplifier configured to buffer an output signal of the inverter to generate a second reference output signal; a second XOR circuit configured to perform the exclusive OR operation on the output signal of the inverter and the second reference output signal; and an OR circuit configured to perform an OR operation on an output signal of the first XOR circuit and an output signal of the second XOR circuit to generate the bias current control signal.

The first reference operational amplifier and the second reference operational amplifier may be configured to have one or more electrical characteristics that are substantially equal. Additionally, or alternatively, the bias current control signal may be configured to be activated during a pulse duration time of a signal with a wider pulse width of the output signal of the first XOR circuit and the output signal of the second XOR circuit.

The bias current control signal is configured to be activated during a longer period of: a first transition period in which the output signal of the first reference operational amplifier changes from a minimum value to half of a maximum value, or a second transition period in which the output signal of the second reference operational amplifier changes from the maximum value to half of the maximum value.

The bias current control signal may be configured to be activated during a longer period of: a first transition period in which the output signal of the first reference operational amplifier increases from a ground voltage to half of a supply voltage, or a second transition period in which the output signal of the second reference operational amplifier decreases from the supply voltage to half of the supply voltage.

The channel amplifying circuit may include a plurality of channel amplifiers configured to generate the plurality of output voltage signals, wherein each of the channel amplifiers may include a differential input unit configured to include a P-type differential input unit and an N-type differential input unit, and receive an input voltage signal and an output voltage signal in a differential mode; an upper bias unit electrically connected to the P-type differential input unit, and configured to connect the P-type differential input unit to a supply voltage and to adjust a magnitude of a bias current supplied to the P-type differential input unit in response to the bias current control signal; a lower bias unit electrically connected to the N-type differential input unit, and configured to connect the N-type differential input unit to a ground voltage and to adjust a magnitude of a bias current supplied to the N-type differential input unit in response to the bias current control signal; a load stage electrically connected to the differential input unit, and configured to operate as a load of the differential input unit; and an output stage electrically connected to the load stage, and configured to connect an output terminal of the load stage to the supply voltage or the ground.

The reference operational amplifier and the channel amplifiers may be configured to have one or more electric characteristics that are substantially equal. The upper bias unit may include a first PMOS transistor configured to have a source connected to the supply voltage, a gate to which a first bias voltage is applied, and a drain connected to the P-type differential input unit; a second PMOS transistor configured to have a source connected to the supply voltage, and a gate to which the first bias voltage is applied; and a switch configured to be coupled between a drain of the second PMOS transistor and the P-type differential input unit, and turned on or off in response to the bias current control signal. A size of the second PMOS transistor may be substantially half that of the first PMOS transistor.

The lower bias unit may include a first NMOS transistor configured to have a source connected to the ground voltage, a gate to which a second bias voltage is applied, and a drain connected to the N-type differential input unit; a second NMOS transistor configured to have a source connected to the ground voltage, and a gate to which the second bias voltage is applied; and a switch configured to be coupled between a drain of the second NMOS transistor and the N-type differential input unit, and turned on or off in response to the bias current control signal. A size of the second NMOS transistor may be substantially half of that of the first NMOS transistor.

The upper bias unit may include a first PMOS transistor configured to have a source connected to the supply voltage, a gate to which a first bias voltage is applied, and a drain connected to the P-type differential input unit; a second PMOS transistor configured to have a source connected to the supply voltage, and a gate to which the first bias voltage is applied; a third PMOS transistor configured to have a source connected to the supply voltage, and a gate to which the first bias voltage is applied; a fourth PMOS transistor configured to have a source connected to the supply voltage, and a gate to which the first bias voltage is applied; a first switch configured to be coupled between a drain of the second PMOS transistor and the P-type differential input unit, and turned on or off in response to the bias current control signal; a second switch configured to be coupled between a drain of the third PMOS transistor and the P-type differential input unit, and turned on or off in response to a first bit of a gray code; and a third switch configured to be coupled between a drain of the fourth PMOS transistor and the P-type differential input unit, and turned on or off in response to a second bit of the gray code.

A size of the second PMOS transistor may be about half of that of the first PMOS transistor, a size of the third PMOS transistor may be about one fourth of that of the first PMOS transistor, and a size of the fourth PMOS transistor may be about one eighth of that of the first PMOS transistor.

The lower bias unit may include a first NMOS transistor configured to have a source connected to the ground voltage, a gate to which a second bias voltage is applied, and a drain connected to the N-type differential input unit; a second NMOS transistor configured to have a source connected to the ground voltage, and a gate to which the second bias voltage is applied; a third NMOS transistor configured to have a source connected to the ground voltage, and a gate to which the second bias voltage is applied; a fourth NMOS transistor configured to have a source connected to the ground voltage, and a gate to which the second bias voltage is applied; a first switch configured to be coupled between a drain of the second NMOS transistor and the N-type differential input unit, and turned on or off in response to the bias current control signal; a second switch configured to be coupled between a drain of the third NMOS transistor and the N-type differential input unit, and turned on or off in response to a first bit of a gray code; and a third switch configured to be coupled between a drain of the fourth NMOS transistor and the N-type differential input unit, and turned on or off in response to a second bit of the gray code.

A size of the second NMOS transistor may be about half of that of the first NMOS transistor, a size of the third NMOS transistor may be about one fourth of that of the first NMOS transistor, and a size of the fourth NMOS transistor may be about one eighth of that of the first NMOS transistor.

In accordance with another embodiment, a source driving circuit of a display device includes a shift register configured to generate a pulse signal based on a clock signal and an input/output control signal; a data latch circuit configured to latch data according to a shift sequence of the shift register and output the data as digital input signals in response to a load signal; and a digital-to-analog converting circuit configured to generate input voltage signals corresponding to the digital input signals using a gray voltage; and an output buffer circuit configured to buffer the input voltage signals to generate source signals, the output buffer circuit comprising: a bias current control signal generating circuit configured to include a reference operational amplifier, the bias current control signal generating circuit configured to perform an exclusive OR operation on an input signal and an output signal of the reference operational amplifier to generate a bias current control signal; and a channel amplifying circuit configured to adjust a slew rate of a plurality of output voltage signals in response to the bias current control signal, the channel amplifying circuit configured to perform buffering on a plurality of input voltage signals to generate the plurality of output voltage signals.

In accordance with another embodiment, a method of operating a source driving circuit of a display device includes generating a pulse signal based on a clock signal and an input/output control signal using a shift register; latching data according to a shift sequence of the shift register and outputting the data as digital input signals in response to a load signal; generating input voltage signals corresponding to the digital input signals using a gray voltage; performing an exclusive OR operation on an input signal and an output signal of a reference operational amplifier to generate a bias current control signal; and adjusting a slew rate of a plurality of source signals in response to the bias current control signal, and performing buffering on the input voltage signals to generate the plurality of source signals. Also, the method may include adjusting the slew rate of the plurality of source signals based on a gray code of the source driving circuit.

In accordance with another embodiment, a circuit includes a controller to generate a control signal based on a first reference signal and a second reference signal; and a signal generator to generate at least one output signal based on the control signal from the controller, wherein the signal generator adjusts a current of an input signal in response to the control signal to change a slew rate of the output signal, wherein the output signal includes information for controlling a display device. The input signal may include a gamma voltage.

The controller may compare the first and second reference signals, and generates the control signal based on the comparison. The signal generator may change the slew rate based on the adjusted current and a gray code of the display device. Additionally, or alternatively, the signal generator may adjust the current of the input signal by adding a bias current to the input signal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
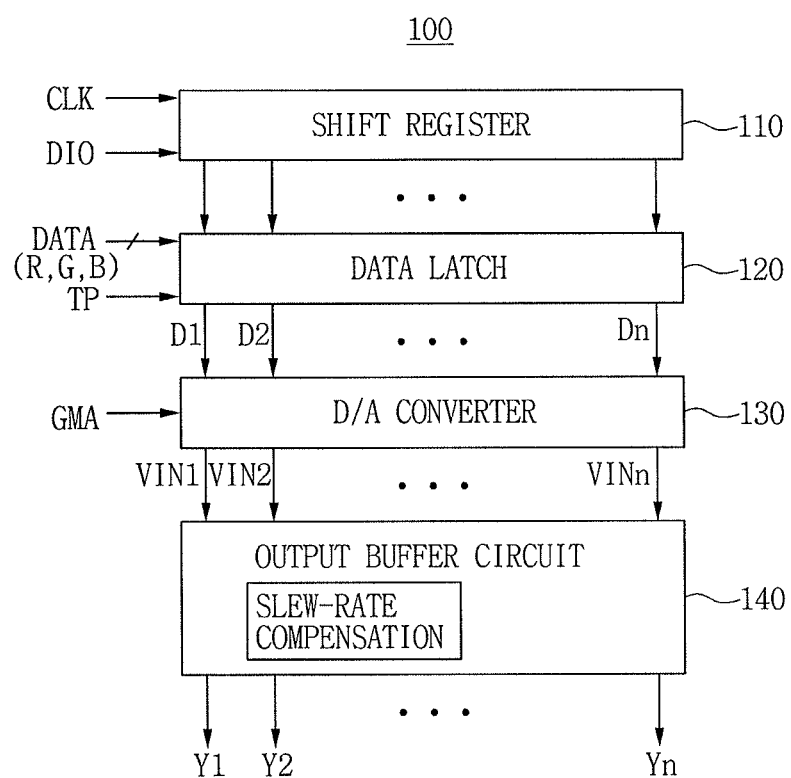
FIG. 1 illustrates an embodiment of a source driving circuit.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout.

FIG. 1 illustrates an embodiment of a source driving circuit 100 which includes a shift register 110, a data latch circuit 120, a digital-to-analog converter 130, and an output buffer circuit 140.

The shift register 110 may generate a pulse signal based on a clock signal CLK and an input/output control signal DIO. The data latch circuit 120 may receive data DATA and a load signal TP. The data latch circuit 120 may latch data DATA according to a shift sequence of the shift register 110 and outputs the data DATA when the load signal TP is applied.

The digital-to-analog converter 130 may generate input voltage signals VIN1 to VINn, which are analog signals, corresponding to output signals D1 to Dn of the data latch circuit 120 using a gray voltage GMA.

The output buffer circuit 140 may compensate a slew rate and buffers the input voltage signals VIN1 to VINn to generate source signals Y1 to Yn. The source signals Y1 to Yn may be output to each source line according to a sequence of data DATA applied to the data latch circuit 120. In accordance with one embodiment, the source driving circuit 100 may have a structure of an output buffer circuit as described hereinafter.

The output buffer circuit 140 included in the source driving circuit 100 may include a bias current control signal generating circuit and a channel amplifying circuit. The bias current control signal generating circuit may include a reference operational amplifier, and perform an exclusive OR operation on an input signal and an output signal of the reference operational amplifier to generate a bias current control signal. The channel amplifying circuit may compensate for a slew rate in response to the bias current control signal, and perform buffering on a plurality of input voltage signals to generate a plurality of output voltage signals. The output buffer circuit may further compensate for the slew rate in response to a gray code of a source driving circuit of a display device. A magnitude of a tail current of the plurality of output signals may be adjusted according to a combination of bits of the gray code. The slew rate may increase according to an increase of the tail current. That is, as the magnitude of the tail current of an output signal increases, a transition time of the output voltage signal becomes shorter.

Figure 2:
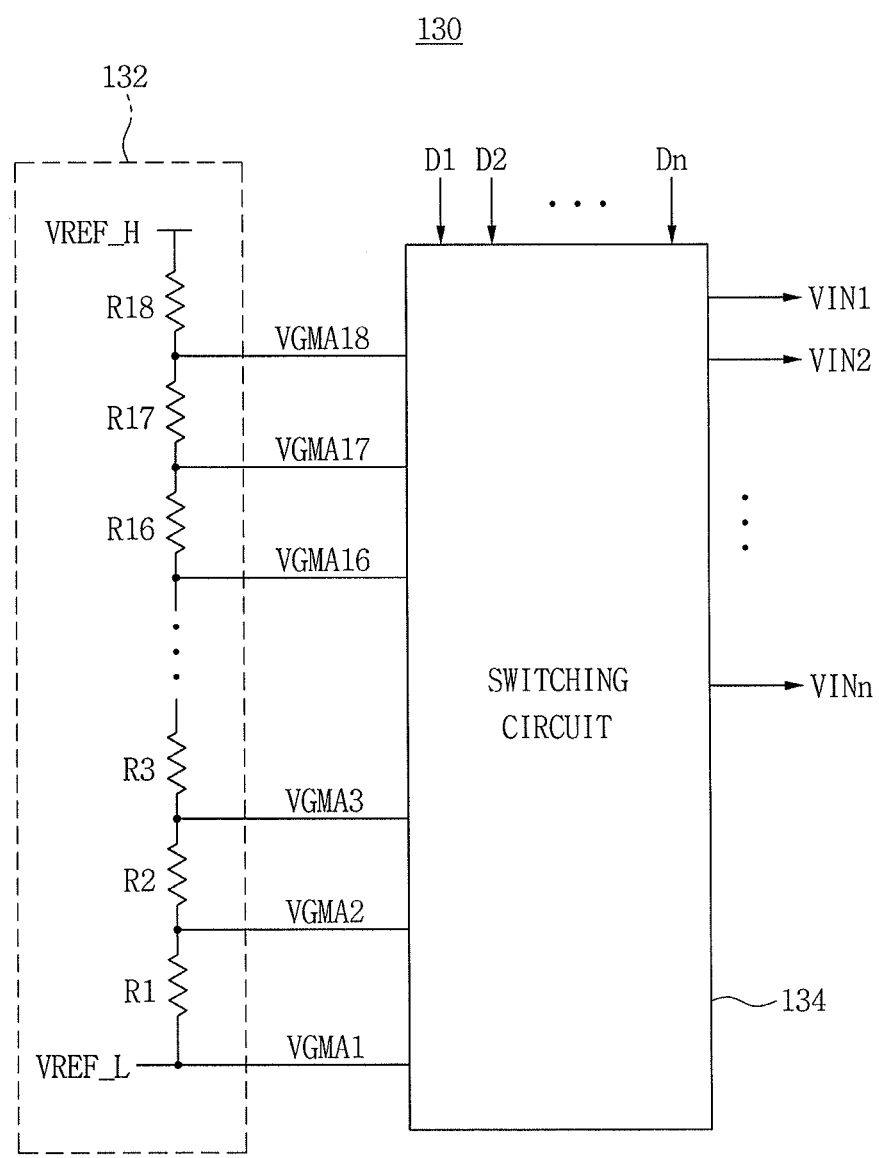
FIG. 2 illustrates an embodiment of a digital-to-analog converter in the source driving circuit of FIG. 1.

FIG. 2 illustrates an embodiment of the digital-to-analog converter 130 in the source driving circuit of FIG. 1. Referring to FIG. 2, the digital-to-analog converter 130 may include a resistor string 132 and a switching circuit 134.

The resistor string 132 may be coupled between a first reference voltage VREF_H and a second reference voltage VREF_L, and may include a plurality of resistors R1 to R18 serially connected to each other. Nodes coupled to the resistors may output gamma voltages VGMA1 to VGMA18. When a digital input signal D1, D2, ..., and Dn is 18-bit data, the resistor string 132 may include 18 resistors and may output 18 gamma voltages VGMA1 to VGMA18.

The switching circuit 134 may output the gamma voltages VGMA1 to VGMA18 corresponding to the digital input signal D1, D2, ..., and Dn as input voltage signals VIN1 to VINn. While 18 resistors are shown, in other embodiments a different number of resistors may be used and/or a different number of gamma voltages may be generated.

Figure 3:
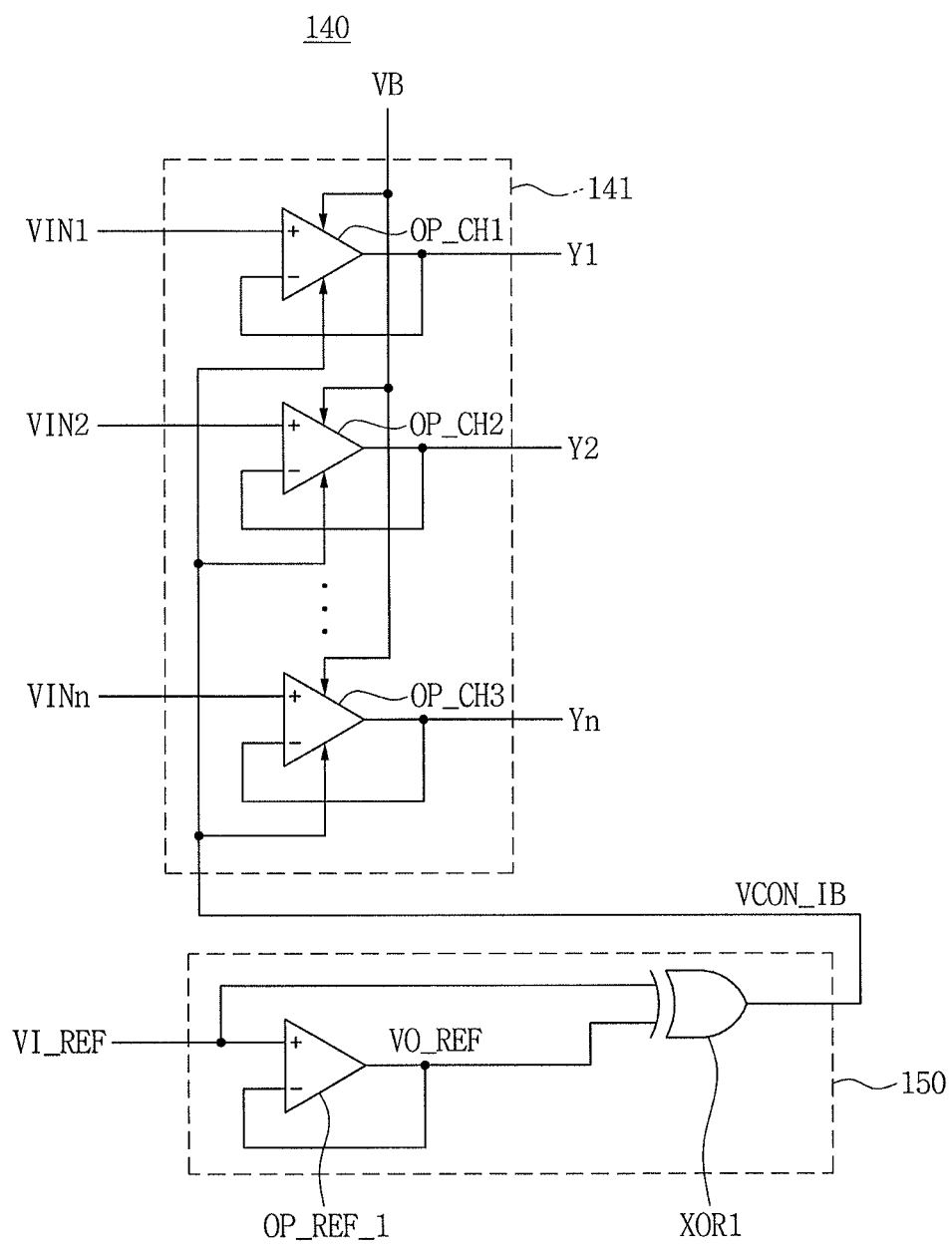
FIG. 3 illustrates an embodiment of an output buffer circuit in the source driving circuit of FIG. 1.

FIG. 3 illustrates an embodiment of an output buffer circuit 140 in the source driving circuit of FIG. 1. Referring to FIG. 3, the output buffer circuit 140 may include a bias current control signal generating circuit 150 and a channel amplifying circuit 141.

The bias current control signal generating circuit 150 may include a reference operational amplifier OP_REF_1, and may perform an exclusive OR operation on an input signal VI_REF and an output signal VO_REF of the reference operational amplifier OP_REF_1. The exclusive OR operation generates a bias current control signal VCON_IB. The channel amplifying circuit 141 may compensate for a slew rate in response to the bias current control signal VCON_IB, and perform buffering on input voltage signals VIN1 to VINn to generate output voltage signals Y1 to Yn. The channel amplifying circuit 141 may include channel amplifiers OP_CH1, OP_CH2 and OP_CH3.

More specifically, the bias current control signal generating circuit 150 may include a reference operational amplifier OP_REF_1 and an exclusive OR (XOR) circuit XOR1. The XOR circuit XOR1 may perform the exclusive OR operation on the input signal VI_REF and the output signal VO_REF of the reference operational amplifier OP_REF_1 to generate the bias current control signal VCON_IB.

The bias current control signal VCON_IB may be activated during a transition period in which the output signal of the reference operational amplifier OP_REF_1 changes from a minimum value to half of a maximum value. In one embodiment, the bias current control signal VCON_IB may be activated during a transition period in which the output signal of the reference operational amplifier OP_REF_1 changes from a ground voltage to a half of a supply voltage.

Figure 4:
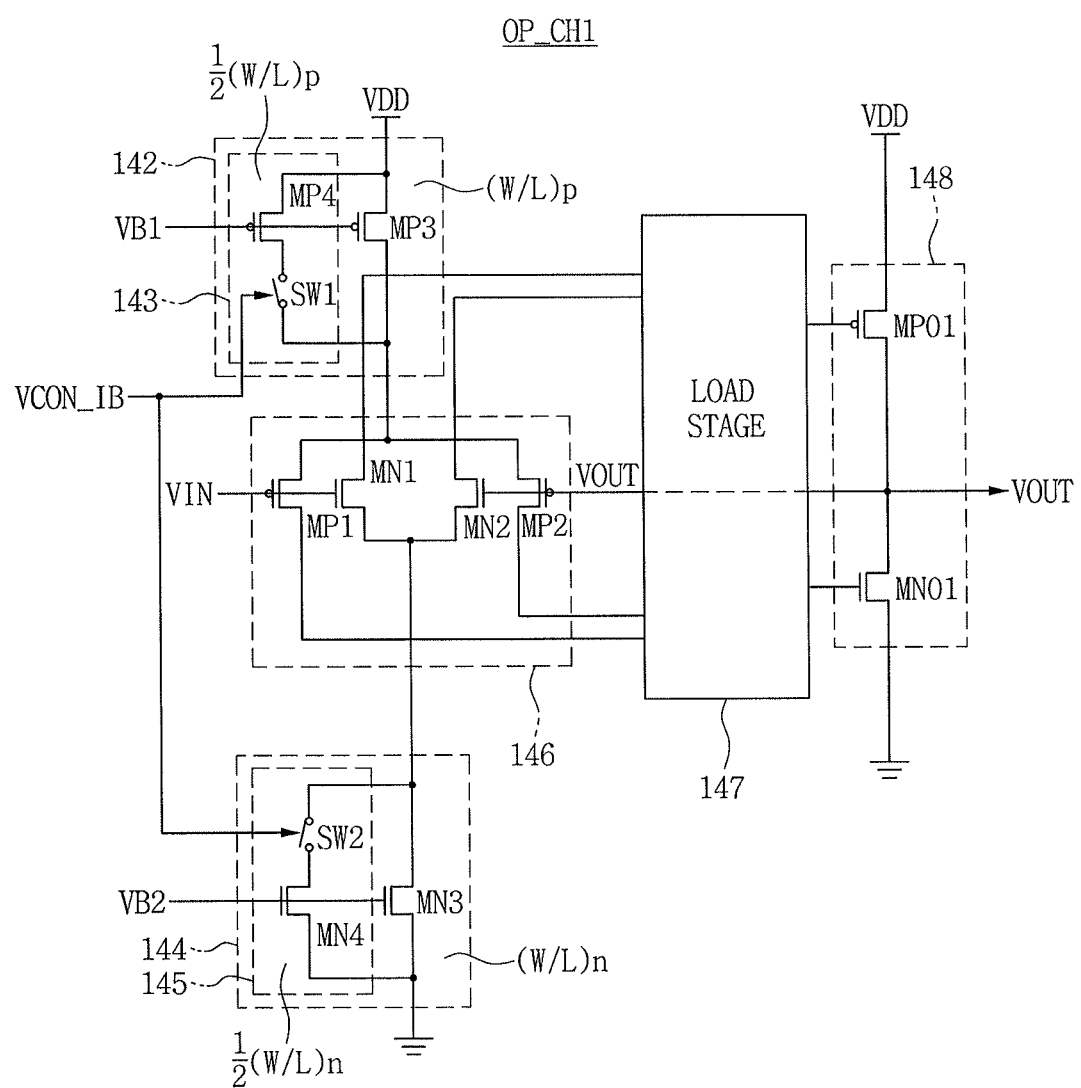
FIG. 4 illustrates an embodiment of a channel amplifier of a channel amplifying circuit of the output buffer circuit of FIG. 3.

FIG. 4 illustrates an embodiment of the channel amplifier OP_CH1 in the channel amplifying circuit 141 of the output buffer circuit of FIG. 3. Referring to FIG. 4, the channel amplifier OP_CH1 may include a differential input unit 146, an upper bias unit 142, a lower bias unit 144, a load stage 147, and an output stage 148.

The differential input unit 146 may include a P-type differential input unit and an N-type differential input unit, and may receive an input voltage signal VIN and an output voltage signal VOUT in a differential mode. The P-type differential input unit may include PMOS transistors MP1 and MP2, and the N-type differential input unit may include NMOS transistors MN1 and MN2.

The upper bias unit 142 may be electrically connected to the P-type differential input unit, connect the P-type differential input unit to a supply voltage VDD, and adjust a magnitude of a bias current supplied to the P-type differential input unit in response to the bias current control signal VCON_IB.

The lower bias unit 144 may be electrically connected to the N-type differential input unit, connect the N-type differential input unit to a ground voltage, and adjust a magnitude of a bias current supplied to the N-type differential input unit in response to the bias current control signal VCON_IB.

The load stage 147 may be electrically connected to the differential input unit 146, and operate as a load of the differential input unit 146. The output stage 148 may be electrically connected to the load stage 147, and connect an output terminal of the load stage 147 to the supply voltage VDD or the ground. In one embodiment, the reference operational amplifier OP_REF_1 and the channel amplifiers OP_CH1, OP_CH2 and OP_CH3 may have the same electric characteristics.

The upper bias unit 142 may include a first PMOS transistor MP3, a second PMOS transistor MP4, and a switch SW1. The first PMOS transistor MP3 may have a source connected to the supply voltage VDD, a gate to which a first bias voltage VB1 is applied, and a drain connected to the P-type differential input unit. The second PMOS transistor MP4 may have a source connected to the supply voltage VDD, and a gate to which the first bias voltage VB1 is applied. The switch SW1 may be coupled between a drain of the second PMOS transistor MP4 and the P-type differential input unit, and turned on or off in response to the bias current control signal VCON_IB. The size of the second PMOS transistor may be a half of that of the first PMOS transistor.

The lower bias unit 144 may include a first NMOS transistor MN3, a second NMOS transistor MN4, and a switch SW2. The first NMOS transistor MN3 may have a source connected to the ground voltage, a gate to which a second bias voltage VB2 is applied, and a drain connected to the N-type differential input unit. The second NMOS transistor MN4 may have a source connected to the ground voltage, and a gate to which the second bias voltage VB2 is applied. The switch SW2 may be coupled between a drain of the second NMOS transistor MN4 and the N-type differential input unit, and turned on or off in response to the bias current control signal VCON_IB. The size of the second NMOS transistor may be a half of that of the first NMOS transistor.

The channel amplifier OP_CH1 may compensate for a slew rate of an output voltage by adjusting bias currents supplied to the differential input unit 146 in response to the bias current control signal VCON_IB. This may be accomplished using bias current adjusting unit 143 included in the upper bias unit 142 and bias current adjusting unit 145 included in the lower bias unit 144.

The bias current adjusting unit 143 may include the second PMOS transistor MP4 and the switch SW1. The bias current adjusting unit 145 may include the second NMOS transistor MN4 and the switch SW2. The channel amplifier OP_CH1 may supply additional bias current to the differential input unit 146 during a transition period of an output signal in response to the bias current control signal VCON_IB.

Figure 5:
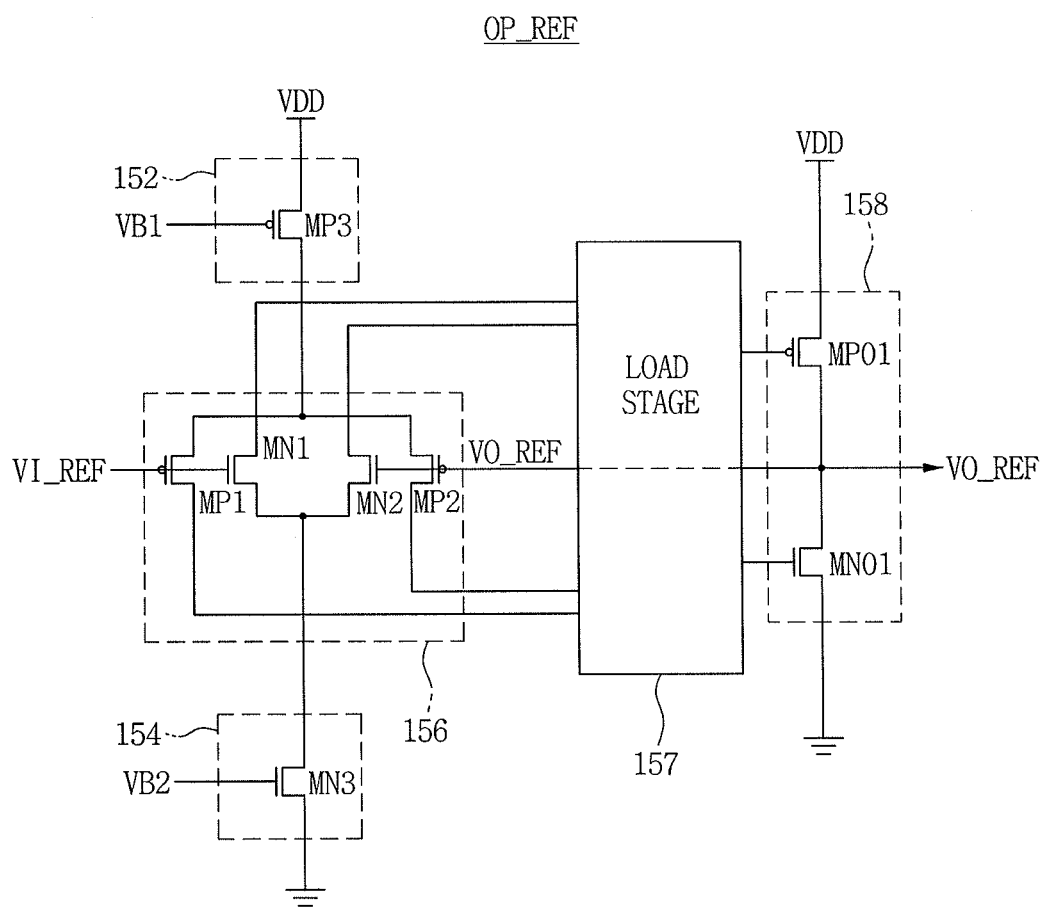
FIG. 5 illustrates an embodiment of a reference operational amplifier in the bias current control signal generating circuit of the output buffer circuit of FIG. 3.

FIG. 5 illustrates an embodiment of the reference operational amplifier OP_REF in the bias current control signal generating circuit 150 of the output buffer circuit of FIG. 3. Referring to FIG. 5, the reference operational amplifier OP_REF may include a differential input unit 156, an upper bias unit 152, a lower bias unit 154, a load stage 157, and an output stage 158. The structure of the reference operational amplifier OP_REF of FIG. 5 may be the same as that of the channel amplifier OP_CH1, except for the bias current adjusting units 143 and 145. Therefore, the electric characteristics of the reference operational amplifier OP_REF may be similar to that of the channel amplifier OP_CH1.

Figure 6:
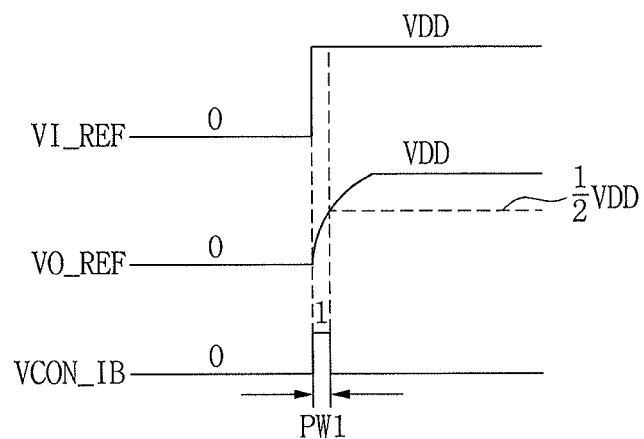
FIG. 6 illustrates an example of a timing diagram for operation of the bias current control signal generating circuit of the output buffer circuit of FIG. 3.
Figure 7:
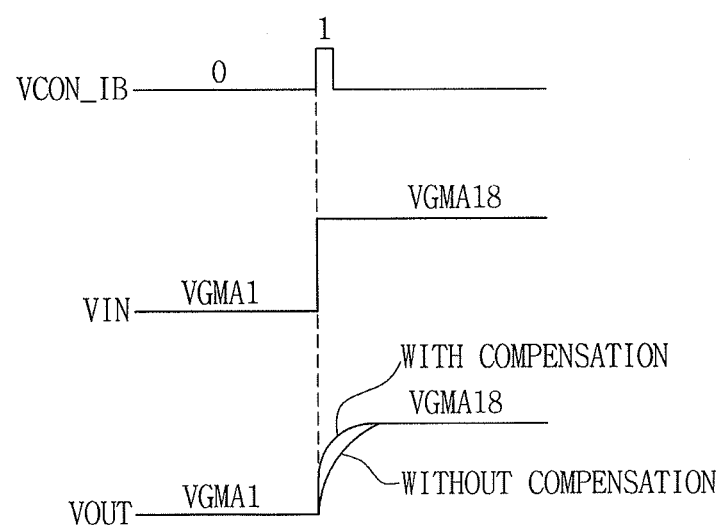
FIG. 7 illustrates an example of a timing diagram for operation of the channel amplifier of the output buffer circuit of FIG. 3.

FIG. 6 illustrates an example of a timing diagram for operation of the bias current control signal generating circuit of the output buffer circuit of FIG. 3, and FIG. 7 illustrates an example of a timing diagram illustrating an operation of the channel amplifier of the output buffer circuit of FIG. 3.

Referring to FIG. 6, when an input signal of the reference operational amplifier OP_REF (that is, a reference input signal VI_REF) changes from a "0" level to a VDD level, an output signal of the reference operational amplifier OP_REF (that is, a reference output signal VO_REF) may change from the "0" level to the VDD level with a certain slew rate. In the output buffer circuit, the bias current control signal VCON_IB, generated by the bias current control signal generating circuit 150 of FIG. 3, may be activated during a transition period. The transition period may include a period in which the output signal of the reference operational amplifier OP_REF changes from a minimum value (for example, 0V) to half of a maximum value (for example, VDD). That is, the bias current control signal VCON_IB may have a pulse width PW1, and provide an additional bias current to the channel amplifiers of the channel amplifying circuit 141 during a period of the pulse width PW1.

Referring to FIG. 7, when the input signal VIN of the channel amplifier changes from a minimum gamma value VGMA1 to a maximum gamma value VGMA18, the output signal VOUT of the channel amplifier may transit from the minimum gamma value VGMA1 to the maximum gamma value VGMA18 with a certain slew rate.

In accordance with one embodiment of the output buffer circuit, during a transition period of the output voltage signal VOUT of the channel amplifier, the bias current control signal VCON_IB generated by the bias current control signal generating circuit 150 may provide an additional bias current to the channel amplifiers. As a result, the slew rate may be compensated.

Since the output buffer circuit compensates for slew rate, the output buffer circuit may have an increased slew rate and a transition of a voltage level may be accomplished in a shorter time compared with an output buffer circuit without a slew rate compensation. The bias current control signal VCON_IB may be activated during a transition period, in which the output signal of the reference operational amplifier OP_REF changes from a minimum value (for example, 0V) to a half of a maximum value (for example, VDD).

Figure 8:
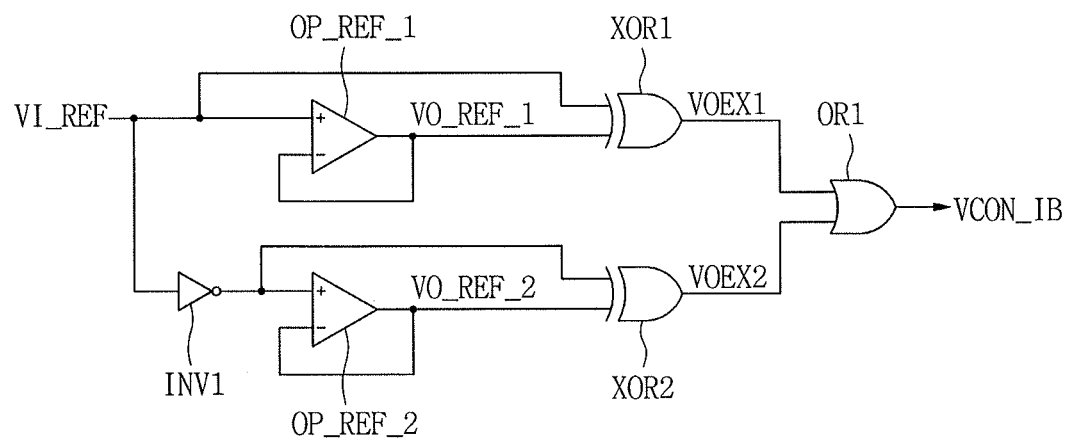
FIG. 8 illustrates an embodiment of a structure of a bias current control signal generating circuit of the output buffer circuit of FIG. 3.

FIG. 8 illustrates an embodiment of the bias current control signal generating circuit of the output buffer circuit of FIG. 3. Referring to FIG. 8, the bias current control signal generating circuit 150a may include a first reference operational amplifier OP_REF_1, a first XOR circuit XOR1, an inverter INV1, a second reference operational amplifier OP_REF_2, a second XOR circuit XOR2, and an OR circuit OR1.

The first reference operational amplifier OP_REF_1 may buffer a first reference input signal VI_REF to generate a first reference output signal VO_REF_1. The first XOR circuit XOR1 may perform the exclusive OR operation on the first reference input signal VI_REF and the first reference output signal VO_REF_1. The inverter INV1 may invert a phase of the first reference input signal VI_REF. The second reference operational amplifier OP_REF_2 may buffer an output signal of the inverter INV1 to generate a second reference output signal VO_REF_2. The second XOR circuit XOR2 may perform the exclusive OR operation on the output signal of the inverter INV1 and the second reference output signal VO_REF_2. The OR circuit OR1 may perform an OR operation on an output signal of the first XOR circuit XOR1 and an output signal of the second XOR circuit XOR2 to generate the bias current control signal VCON_IB.

Figure 9:
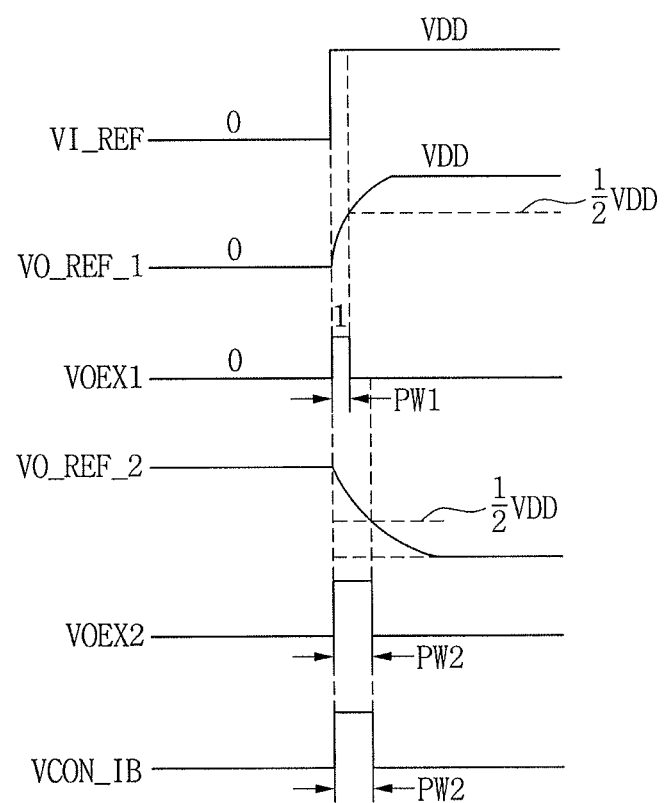
FIG. 9 illustrates an example of a timing diagram for operation of the bias current control signal generating circuit of FIG. 8.

FIG. 9 illustrates an example of a timing diagram for operation of the bias current control signal generating circuit 150a. Referring to FIGS. 8 and 9, the bias current control signal generating circuit 150a may perforin an OR operation on an output signal VOEX1 of the first XOR circuit XOR1 and an output signal VOEX2 of the second XOR circuit XOR2 to generate the bias current control signal VCON_IB. Therefore, the pulse width of the bias current control signal VCON_IB may be determined by a signal with a wider pulse width of VOEX1 which has a pulse width PW1 and VOEX2 which has a pulse width PW2. The bias current control signal generating circuit 150a of FIG. 8 may supply an enough additional bias current even when a rising transition time and a falling transition time of the reference output signals VO_REF_1 and VO_REF_2 are not equal to each other, and then perform a slew rate compensation.

Figure 10:
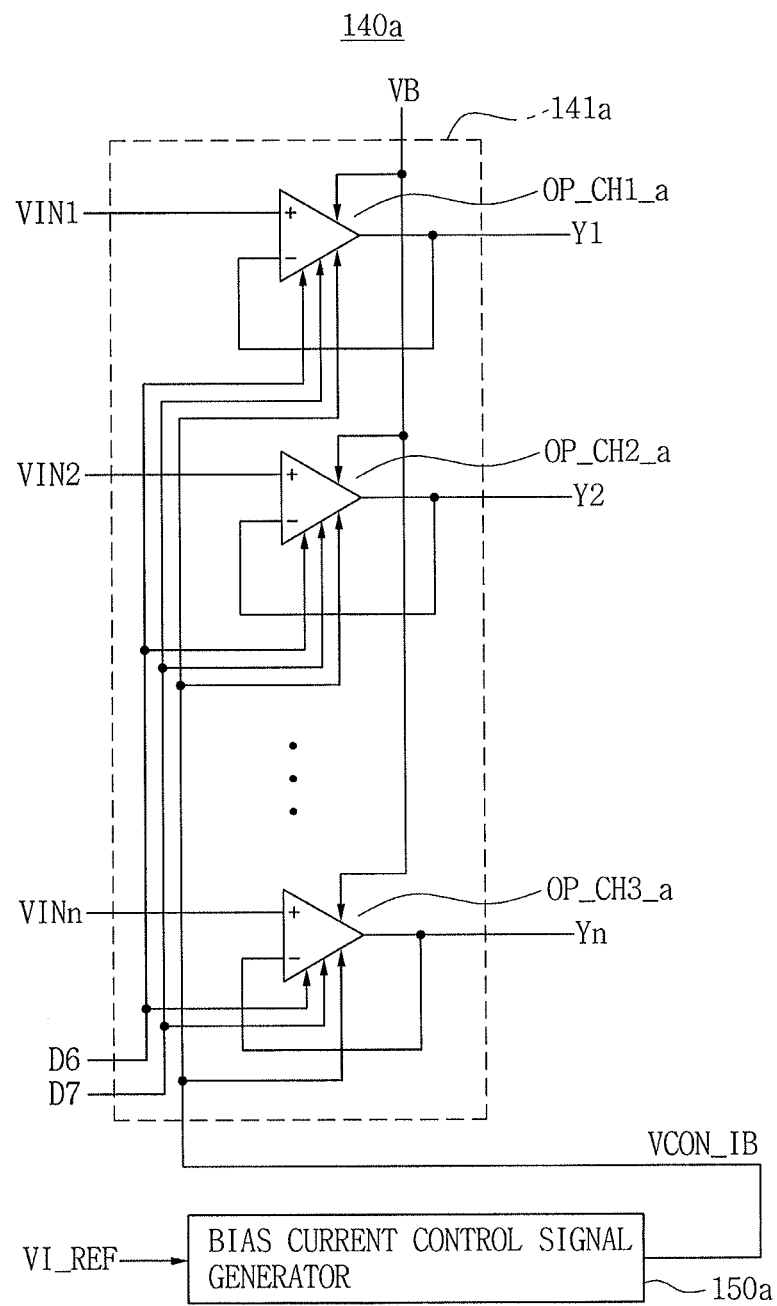
FIG. 10 illustrates another embodiment of an output buffer circuit in the source driving circuit of FIG. 1.

FIG. 10 illustrates another embodiment of an output buffer circuit in the source driving circuit of FIG. 1. Referring to FIG. 10, the output buffer circuit 140a may include a bias current control signal generating circuit 150a and a channel amplifying circuit 141a.

The bias current control signal generating circuit 150a may have the same structure as the bias current control signal generating circuit 150 of FIG. 3. The channel amplifying circuit 141a may compensate for a slew rate in response to the bias current control signal VCON_IB and a gray code, and perform buffering on input voltage signals VIN1 to VINn to generate output voltage signals Y1 to Yn. The channel amplifying circuit 141a may include channel amplifiers OP_CH1_a, OP_CH2_a and OP_CH3_a.

The bias current control signal generating circuit 150a of FIG. 10 may adjust the bias current in response to bits D6 and D7 of the gray code, as well as the bias current control signal VCON_IB. Therefore, the slew rate may be more precisely compensated. The bits D6 and D7 of the gray code may be selected codes from the output signals D1 to Dn of the data latch circuit 120 of FIG. 1.

Figure 11:
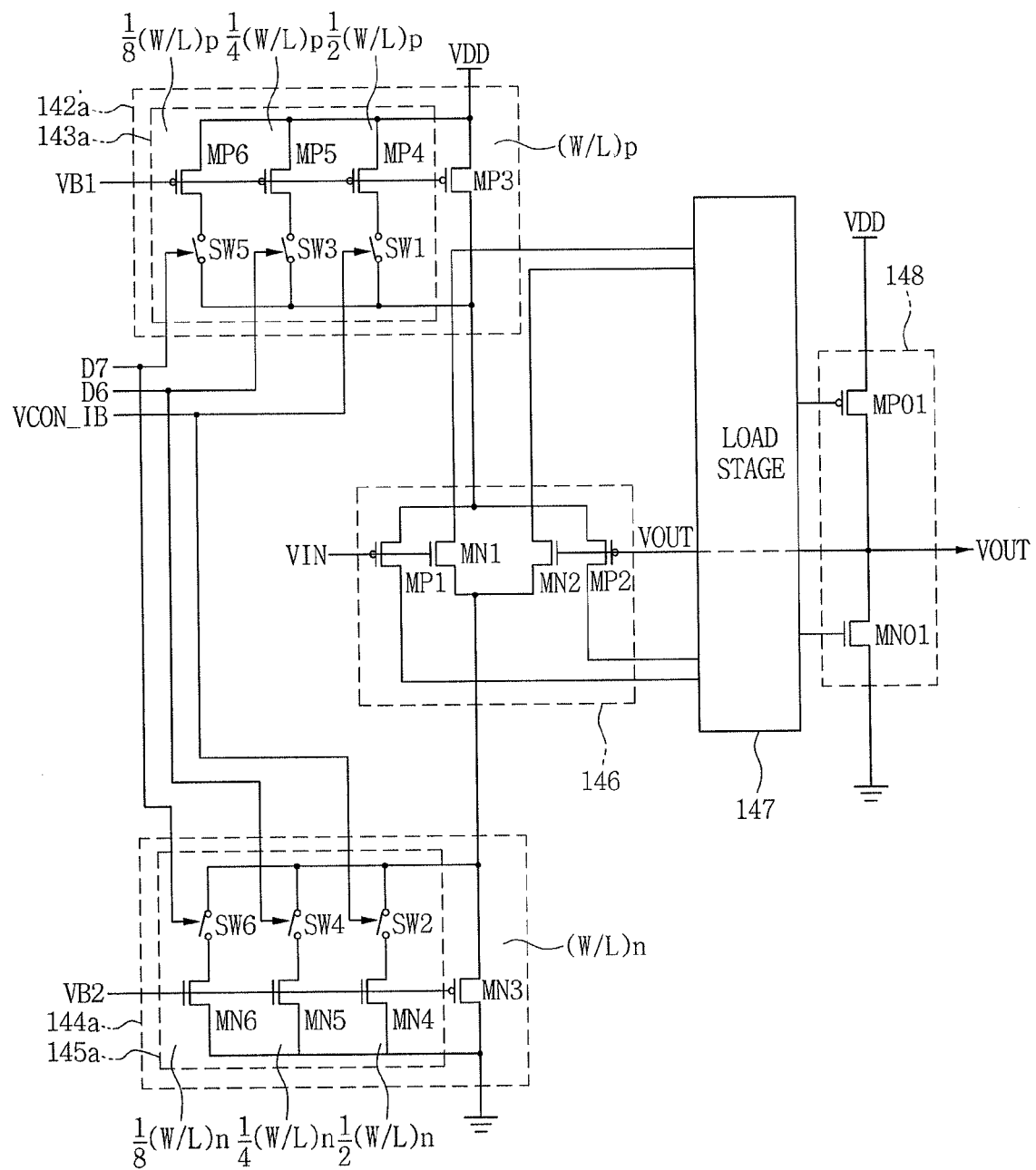
FIG. 11 illustrates an embodiment of a channel amplifier in a channel amplifying circuit of the output buffer circuit of FIG. 10.

FIG. 11 illustrates an embodiment of a channel amplifier in a channel amplifying circuit of the output buffer circuit of FIG. 10. Referring to FIG. 11, the channel amplifier OP_CH1_a may include a differential input unit 146, an upper bias unit 142a, a lower bias unit 144a, a load stage 147, and an output stage 148.

The differential input unit 146 may include a P-type differential input unit and an N-type differential input unit, and may receive an input voltage signal VIN and an output voltage signal VOUT in a differential mode. The P-type differential input unit may include PMOS transistors MP1 and MP2, and the N-type differential input unit may include NMOS transistors MN1 and MN2.

The upper bias unit 142a may be electrically connected to the P-type differential input unit, connect the P-type differential input unit to a supply voltage VDD, and adjust a magnitude of a bias current supplied to the P-type differential input unit in response to the bias current control signal VCON_IB and bits D6 and D7 of a gray code.

The lower bias unit 144a may be electrically connected to the N-type differential input unit, connect the N-type differential input unit to a ground voltage, and adjust a magnitude of a bias current supplied to the N-type differential input unit in response to the bias current control signal VCON_IB and the bits D6 and D7 of the gray code.

The load stage 147 may be electrically connected to the differential input unit 146, and operate as a load of the differential input unit 146. The output stage 148 may be electrically connected to the load stage 147, and connect an output terminal of the load stage 147 to the supply voltage VDD or the ground.

The upper bias unit 142a may include a first PMOS transistor MP3, a second PMOS transistor MP4, a third PMOS transistor MP5, a fourth PMOS transistor MP6, a first switch SW1, a second switch SW3, and a third switch SW5.

The first PMOS transistor MP3 may have a source connected to the supply voltage VDD, a gate to which a first bias voltage VB1 is applied, and a drain connected to the P-type differential input unit. The second PMOS transistor MP4 may have a source connected to the supply voltage VDD, and a gate to which the first bias voltage VB1 is applied. The third PMOS transistor MP5 may have a source connected to the supply voltage VDD, and a gate to which the first bias voltage VB1 is applied. The fourth PMOS transistor MP6 may have a source connected to the supply voltage VDD, and a gate to which the first bias voltage VB1 is applied.

The first switch may be coupled between a drain of the second PMOS transistor MP4 and the P-type differential input unit, and turned on or off in response to the bias current control signal VCON_IB. The second switch may be coupled between a drain of the third PMOS transistor MP5 and the P-type differential input unit, and turned on or off in response to a first bit D6 of a gray code. The third switch SW5 may be coupled between a drain of the fourth PMOS transistor MP6 and the P-type differential input unit, and turned on or off in response to a second bit D7 of the gray code.

The size of the second PMOS transistor MP4 may be less than (e.g., a half of) that of the first PMOS transistor MP3, the size of the third PMOS transistor MP5 may be less than (e.g., one fourth of) the first PMOS transistor MP3, and the size of the fourth PMOS transistor MP6 may be less than (e.g., one eighth of) the first PMOS transistor MP3.

The lower bias unit 144a may include a first NMOS transistor MN3, a second NMOS transistor MN4, a third NMOS transistor MN5, a fourth NMOS transistor MN6, a first switch SW2, a second switch SW4, and a third switch SW6.

The first NMOS transistor MN3 may have a source connected to the ground voltage, a gate to which a second bias voltage VB2 is applied, and a drain connected to the N-type differential input unit. The second NMOS transistor MN4 may have a source connected to the ground voltage, and a gate to which the second bias voltage VB2 is applied. The third NMOS transistor MN5 may have a source connected to the ground voltage, and a gate to which the second bias voltage VB2 is applied. The fourth NMOS transistor MN6 may have a source connected to the ground voltage, and a gate to which the second bias voltage VB2 is applied.

The first switch SW2 may be coupled between a drain of the second NMOS transistor MN4 and the N-type differential input unit, and turned on or off in response to the bias current control signal VCON_IB. The second switch SW4 may be coupled between a drain of the third NMOS transistor MN5 and the N-type differential input unit, and turned on or off in response to the first bit of a gray code D6. The third switch SW6 may be coupled between a drain of the fourth NMOS transistor MN6 and the N-type differential input unit, and turned on or off in response to the second bit D7 of the gray code.

The size of the second NMOS transistor MN4 may be less than (e.g., half of) the first NMOS transistor MN3, the size of the third NMOS transistor MN5 may be less than (e.g., one fourth of) the first NMOS transistor MN3, and the size of the fourth NMOS transistor MN6 may be less than (e.g., one eighth of) the first NMOS transistor MN3.

Figure 12:
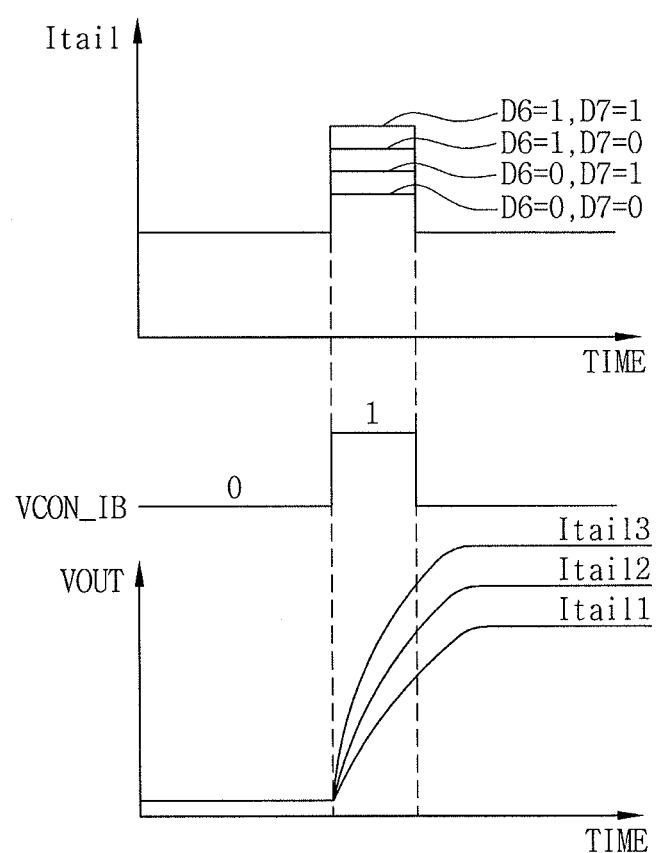
FIG. 12 illustrates a tail current with respect to bit values of a gray code, and a slew rate of an output voltage with respect to a magnitude of the tail currents in a channel amplifier of FIG. 11.

FIG. 12 illustrates a diagram illustrating tail current with respect to bit values of a gray code, and a slew rate of an output voltage with respect to a magnitude of the tail currents in a channel amplifier of FIG. 11.

Referring to FIG. 12, a magnitude of a tail current of the output signals may be configured to be adjusted according to a combination of bits of the gray code. For example, when D6=0 and D7=0, the additional current having the lowest level may be supplied to channel amplifiers. When D6=1 and D7=1, the additional current having the highest level may be supplied to channel amplifiers. As the magnitudes of the tail currents Itail1, Itail2 and Itail3 increase, a level transition of the output voltage of the channel amplifiers may be faster. That is, as the magnitudes of the tail currents Itail1, Itail2 and Itail3 increase, the slew rate may increase.

Figure 13:
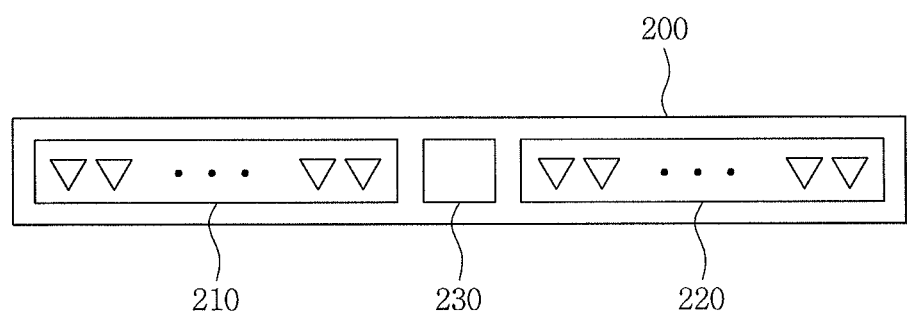
FIGS. 13 and 14 illustrate embodiments which include layouts of a source driving circuit.
Figure 14:
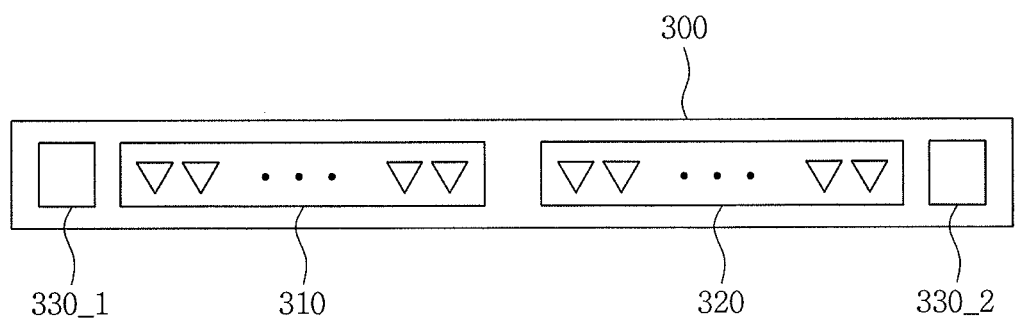

FIGS. 13 and 14 illustrate embodiments of layouts of a source driving circuit. Referring to FIG. 13, the bias current control signal generating circuit 230 may be located between channel amplifying circuits 210 and 220 in the source driving circuit 200. Referring to FIG. 14, the bias current control signal generating circuits 330_1 and 330_2 may be located an outer portion of channel amplifying circuits 310 and 320 in the source driving circuit 300. That is, the bias current control signal generating circuits 330_1 and 330_2 may be located on both ends of the source driving circuit 300.

Figure 15:
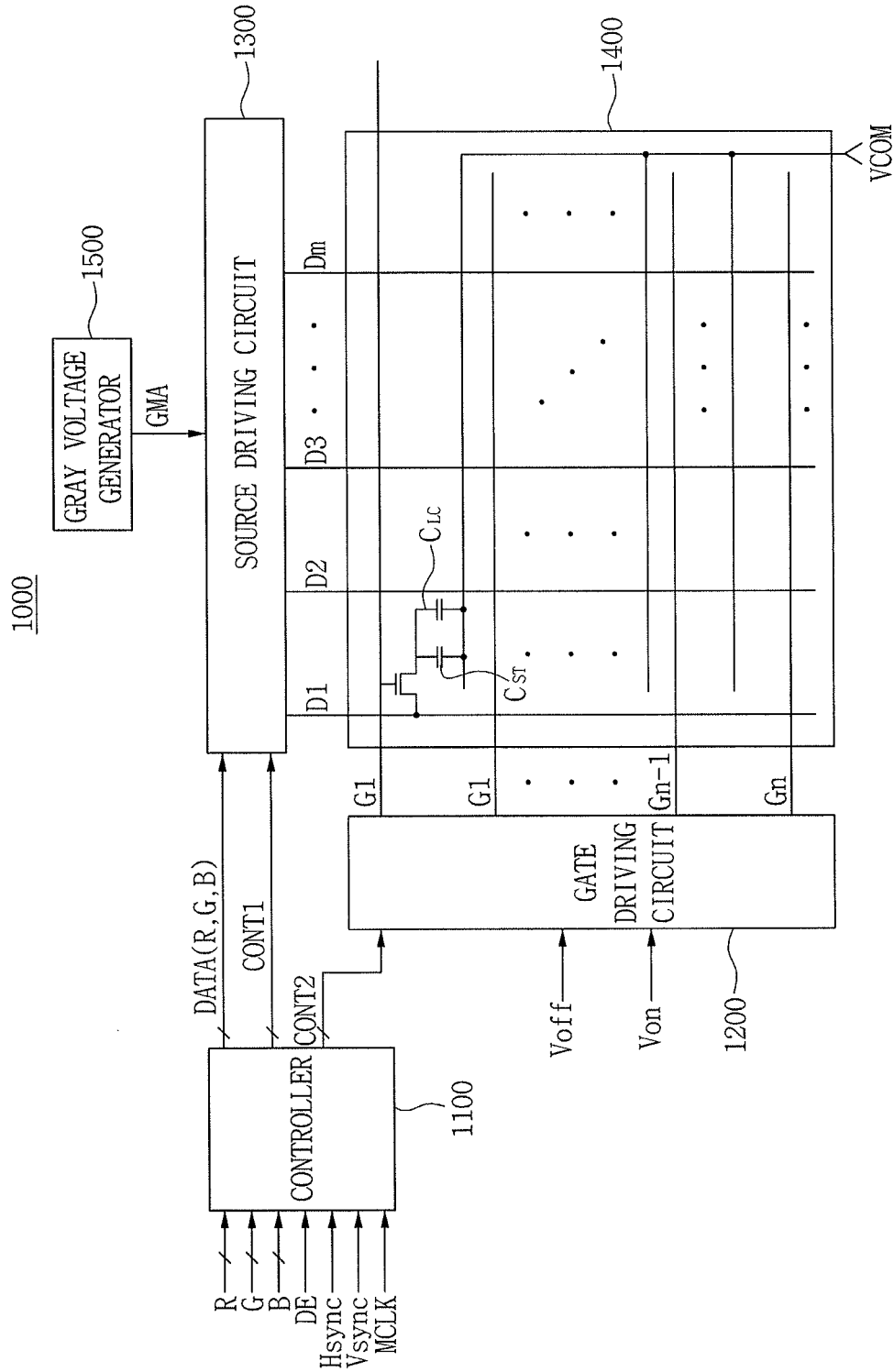
FIG. 15 illustrates an LCD device that includes any of the aforementioned embodiments of the source driving circuit.

FIG. 15 illustrates an embodiment of liquid crystal display (LCD) device 1000 that may include any of the embodiments of the source driving circuit described herein. Referring to FIG. 13, the LCD device 1000 may include a controller 1100, a gate driving circuit 1200, a source driving circuit 1300, a liquid crystal panel 1400, and a gray voltage generator 1500.

The liquid crystal panel 1400 may include TFTs (Thin Film Transistors) located at each intersection of the matrix. The TFT may have a source receiving a source signal (also called a "data signal") and a gate receiving a gate signal (also called a "scan signal"). A storage capacitor CST and a liquid crystal capacitor CLC may be connected between a drain of the TFT and a common voltage VCOM. The liquid crystal panel 1400 may receive the gate signals through gate lines G1 to Gn, and the source signals through source lines D1 to Dm, respectively. The gate driving circuit 1200 may produce the gate signals by combining an on-voltage Von and an off-voltage Voff, and apply the gate signals to the gate lines G1 to Gn.

The gray voltage generator 1500 may generate positive and negative gray scale voltages GMA associated with the brightness of the LCD device 1000.

The source driving circuit 1300 may perform a digital-to-analog (D/A) conversion on data DATA received from the controller 1100 by using the gray scale voltages GMA output from the gray voltage generator 1500, and apply the converted data to the source lines D1 to Dm.

The controller 1100 may receive RGB video signals R, G and B and control signals. The control signals may include, for example, a vertical sync signal Vsync, a horizontal sync signal Hsync, a main clock signal MCLK, a data enable signal DE, and so on. The controller 1100 may generate source control signals CONT1 and gate control signals CONT2 based on the control signals. The controller 1100 may also properly process the RGB video signals R, G and B, so as to meet operation conditions of the liquid crystal panel 1400. Then, the controller 1100 may transmit the gate control signals CONT2 to the gate driving circuit 1200, and transmit the source control signals CONT1 and the video signals DATA (R, G, B) to the source driving circuit 1300.

The gate driving circuit 1200 and the source driving circuit 1300 may include a plurality of gate drive integrated circuits (IC) and a plurality of source drive ICs, respectively. The data DATA may determine a gray level with respect to each pixel. The source driving circuit 1300 may apply the source signals to the source lines arranged on the liquid crystal panel 1400, and the gate driving circuit 1200 may apply the gate signals to the gate lines arranged on the liquid crystal panel 1400.

The source driving circuit 1300 included in the LCD device 1000 of FIG. 15 may have the same structure of a source driving circuit 100 of FIG. 1. Therefore, the LCD device 1000 may include the output buffer circuit according to any of the embodiments described herein.

The output buffer circuit included in the LCD device 1000 may include a bias current control signal generating circuit and a channel amplifying circuit. The bias current control signal generating circuit may include a reference operational amplifier, and perform an exclusive OR operation on an input signal and an output signal of the reference operational amplifier to generate a bias current control signal. The channel amplifying circuit may compensate for a slew rate in response to the bias current control signal, and perform buffering on a plurality of input voltage signals to generate a plurality of output voltage signals.

The output buffer circuit may further compensate for the slew rate in response to a gray code of a source driving circuit of a display device. A magnitude of a tail current of the plurality of output signals may be adjusted according to a combination of bits of the gray code. The slew rate may increase according to an increase of the tail current. That is, as the magnitude of the tail current of an output voltage signal increases, a transition time of the output voltage signal may become shorter.

Figure 16:
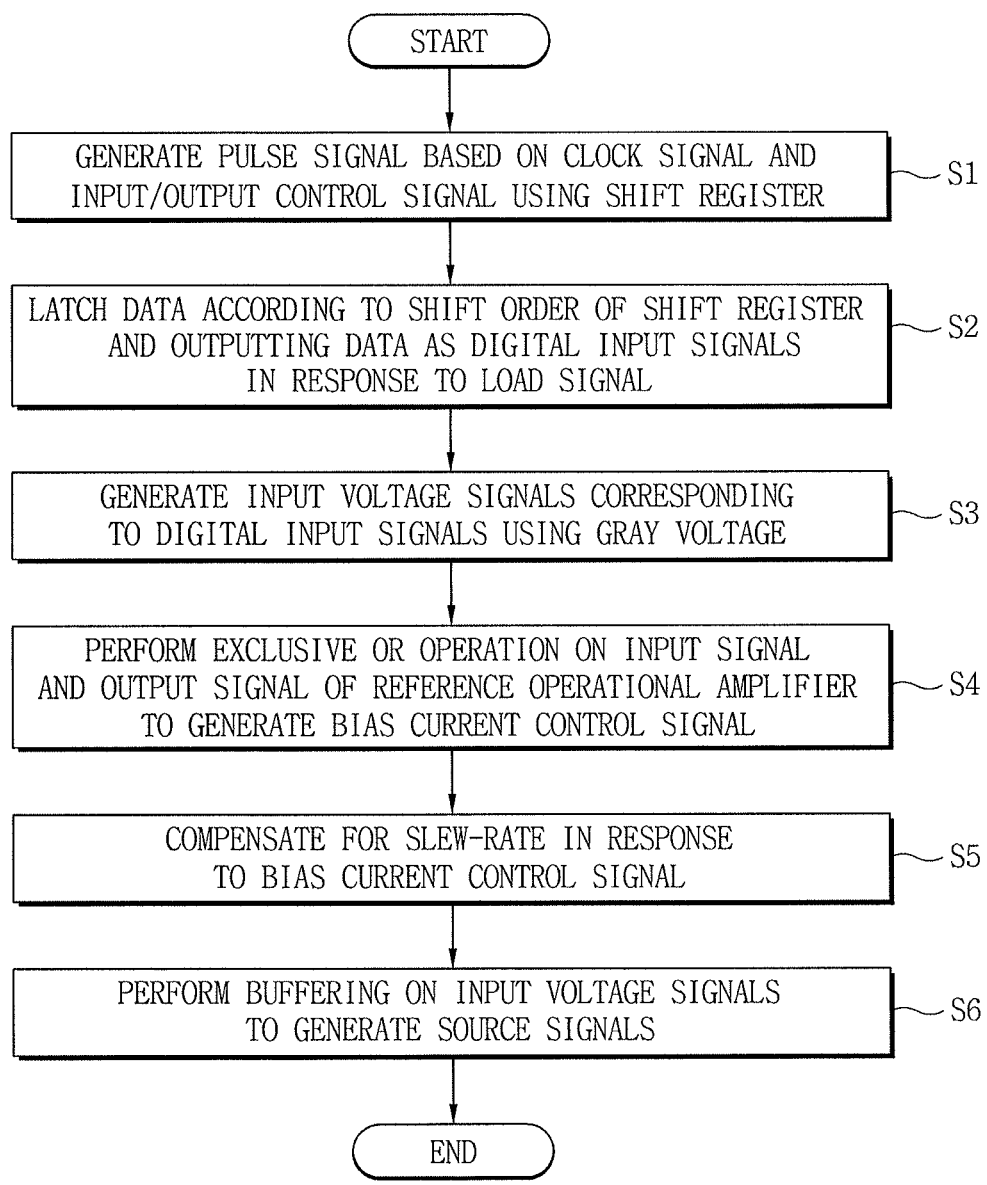
FIG. 16 illustrates an embodiment of a method of operating a source driving circuit of a display device.

FIG. 16 illustrates an embodiment of a method of operating a source driving circuit of a display device. Referring to FIG. 16, the method of operating a source driving circuit of a display device may include the following operations:

(1) generating a pulse signal based on a clock signal and a input/output control signal using a shift register (S1);

(2) latching data according to a shift sequence of the shift register and outputting the data as digital input signals in response to a load signal (S2);

(3) generating input voltage signals corresponding to the digital input signals using a gray voltage (S3);

(4) performing an exclusive OR operation on an input signal and an output signal of a reference operational amplifier to generate a bias current control signal (S4).

(5) compensating for a slew rate in response to the bias current control signal (S5).

(6) performing buffering on the input voltage signals to generate source signals (S6).

Figure 17:
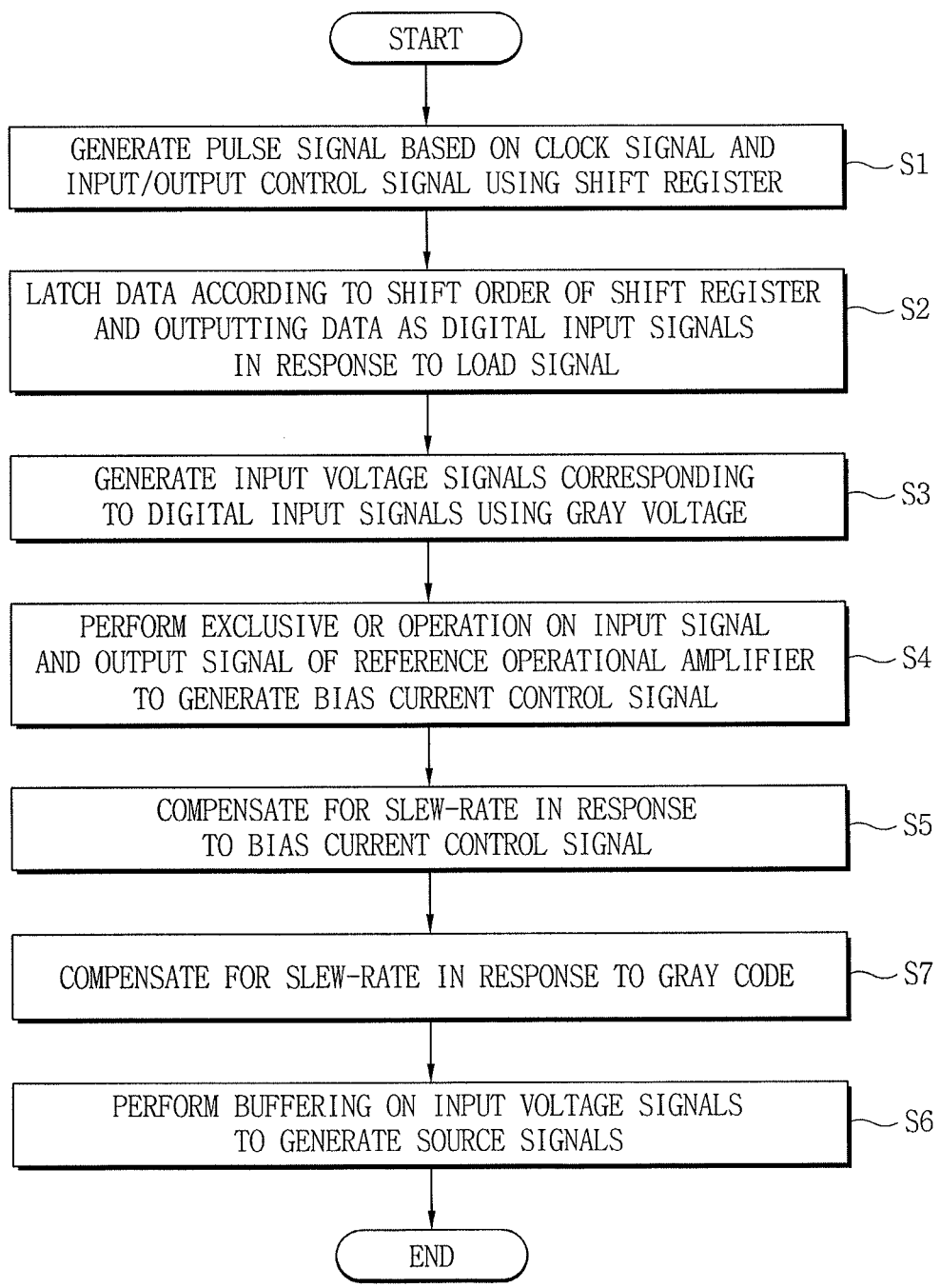
FIG. 17 illustrates another embodiment of a method of operating a source driving circuit of a display device.

FIG. 17 illustrates another embodiment of a method of operating a source driving circuit of a display device. Referring to FIG. 17, the method of operating a source driving circuit of a display device may include the following operations:

(1) generating a pulse signal based on a clock signal and a input/output control signal using a shift register (S1);

(2) latching data according to a shift sequence of the shift register and outputting the data as digital input signals in response to a load signal (S2);

(3) generating input voltage signals corresponding to the digital input signals using a gray voltage (S3);

(4) performing an exclusive OR operation on an input signal and an output signal of a reference operational amplifier to generate a bias current control signal (S4).

(5) compensating for a slew rate in response to the bias current control signal (S5).

(6) compensating for the slew rate in response to a gray code (S7).

(7) performing buffering on the input voltage signals to generate source signals (S6).

In the above, an output buffer circuit, a source driving circuit including the output buffer circuit, and an LCD device having the source driving circuit were described. In other embodiments, the output buffer circuit and source driving circuit including the output buffer may be implemented in other types of display devices, including but not limited to a plasma display panel (PDP) and an organic light emitting diode (OLED).

By way of summation and review, one or more embodiments is directed to providing a source driving circuit to change a slew rate of the output signal, such that the output buffer circuit may be used for a high resolution and large scale panel, and have low power consumption.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An output buffer circuit, comprising:
a bias current control signal generating circuit including a reference operational amplifier, the bias current control signal generating circuit to perform an exclusive OR operation on an input signal and an output signal of the reference operational amplifier to generate a bias current control signal; and
a channel amplifying circuit to adjust a slew rate of a plurality of output voltage signals in response to the bias current control signal, the channel amplifying circuit to perform buffering on a plurality of input voltage signals to generate the plurality of output voltage signals.

2. The circuit as claimed in claim 1, wherein the output buffer circuit is to further adjust the slew rate of the plurality of output voltage signals in response to a gray code of a source driving circuit of a display device.

3. The circuit as claimed in claim 2, wherein a magnitude of a tail current of the plurality of output voltage signals is to be adjusted according to a combination of bits of the gray code.

4. The circuit as claimed in claim 2, wherein the slew rate is to increase with an increase in the tail current.

5. The circuit as claimed in claim 1, wherein the bias current control signal generating circuit comprises: an XOR circuit to perform an exclusive OR operation on the input signal and the output signal of the reference operational amplifier to generate the bias current control signal.

6. The circuit as claimed in claim 5, wherein the bias current control signal is to be activated during a transition period, in which the output signal of the reference operational amplifier changes from a minimum value to half of a maximum value.

7. The circuit as claimed in claim 5, wherein the bias current control signal is to be activated during a transition period, in which the output signal of the reference operational amplifier changes from a ground voltage to half of a supply voltage.

8. The circuit as claimed in claim 1, wherein the bias current control signal generating circuit comprises:
a first reference operational amplifier to buffer a first reference input signal to generate a first reference output signal;
a first XOR circuit to perform the exclusive OR operation on the first reference input signal and the first reference output signal;
an inverter to invert a phase of the first reference input signal;
a second reference operational amplifier to buffer an output signal of the inverter to generate a second reference output signal;
a second XOR circuit to perform the exclusive OR operation on the output signal of the inverter and the second reference output signal; and
an OR circuit to perform an OR operation on an output signal of the first XOR circuit and an output signal of the second XOR circuit to generate the bias current control signal.

9. The circuit as claimed in claim 8, wherein the first reference operational amplifier and the second reference operational amplifier are to have one or more electrical characteristics that are substantially equal.

10. The circuit as claimed in claim 8, wherein the bias current control signal is to be activated during a pulse duration time of a signal with a wider pulse width of the output signal of the first XOR circuit and the output signal of the second XOR circuit.

11. The circuit as claimed in claim 8, wherein the bias current control signal is to be activated during a longer period of:
a first transition period in which the output signal of the first reference operational amplifier changes from a minimum value to half of a maximum value, or
a second transition period in which the output signal of the second reference operational amplifier changes from the maximum value to half of the maximum value.

12. The circuit as claimed in claim 8, wherein the bias current control signal is to be activated during a longer period of:
a first transition period in which the output signal of the first reference operational amplifier increases from a ground voltage to half of a supply voltage, or
a second transition period in which the output signal of the second reference operational amplifier decreases from the supply voltage to half of the supply voltage.

13. The circuit as claimed in claim 1, wherein the channel amplifying circuit includes a plurality of channel amplifiers to generate the plurality of output voltage signals, wherein each of the channel amplifiers comprises:
a differential input unit to include a P-type differential input unit and an N-type differential input unit, and receive an input voltage signal and an output voltage signal in a differential mode;

an upper bias unit electrically connected to the P-type differential input unit, and to connect the P-type differential input unit to a supply voltage and to adjust a magnitude of a bias current supplied to the P-type differential input unit in response to the bias current control signal;

a lower bias unit electrically connected to the N-type differential input unit, and to connect the N-type differential input unit to a ground voltage and to adjust a magnitude of a bias current supplied to the N-type differential input unit in response to the bias current control signal;

a load stage electrically connected to the differential input unit, and to operate as a load of the differential input unit; and an output stage electrically connected to the load stage, and to connect an output terminal of the load stage to the supply voltage or the ground.

14. The circuit as claimed in claim 13, wherein the reference operational amplifier and the channel amplifiers are to have one or more electric characteristics that are substantially equal.

15. The circuit as claimed in claim 13, wherein the upper bias unit comprises:
    a first PMOS transistor to have a source connected to the supply voltage, a gate to which a first bias voltage is applied, and a drain connected to the P-type differential input unit;
    a second PMOS transistor to have a source connected to the supply voltage, and a gate to which the first bias voltage is applied; and
    a switch to be coupled between a drain of the second PMOS transistor and the P-type differential input unit, and turned on or off in response to the bias current control signal.

16. The circuit as claimed in claim 15, wherein a size of the second PMOS transistor is substantially half that of the first PMOS transistor.

17. The circuit as claimed in claim 13, wherein the lower bias unit comprises:
    a first NMOS transistor to have a source connected to the ground voltage, a gate to which a second bias voltage is applied, and a drain connected to the N-type differential input unit;
    a second NMOS transistor to have a source connected to the ground voltage, and a gate to which the second bias voltage is applied; and
    a switch to be coupled between a drain of the second NMOS transistor and the N-type differential input unit, and turned on or off in response to the bias current control signal.

18. The circuit as claimed in claim 17, wherein a size of the second NMOS transistor is substantially half of that of the first NMOS transistor.

19. The circuit as claimed in claim 13, wherein the upper bias unit comprises:
    a first PMOS transistor to have a source connected to the supply voltage, a gate to which a first bias voltage is applied, and a drain connected to the P-type differential input unit;
    a second PMOS transistor to have a source connected to the supply voltage, and a gate to which the first bias voltage is applied;
    a third PMOS transistor to have a source connected to the supply voltage, and a gate to which the first bias voltage is applied;
    a fourth PMOS transistor to have a source connected to the supply voltage, and a gate to which the first bias voltage is applied;
    a first switch to be coupled between a drain of the second PMOS transistor and the P-type differential input unit, and turned on or off in response to the bias current control signal;
    a second switch to be coupled between a drain of the third PMOS transistor and the P-type differential input unit, and turned on or off in response to a first bit of a gray code; and
    a third switch to be coupled between a drain of the fourth PMOS transistor and the P-type differential input unit, and turned on or off in response to a second bit of the gray code.

20. The circuit as claimed in claim 19, wherein a size of the second PMOS transistor is about half of that of the first PMOS transistor, a size of the third PMOS transistor is about one fourth of that of the first PMOS transistor, and a size of the fourth PMOS transistor is about one eighth of that of the first PMOS transistor.

21. The circuit as claimed in claim 13, wherein the lower bias unit comprises:
    a first NMOS transistor to have a source connected to the ground voltage, a gate to which a second bias voltage is applied, and a drain connected to the N-type differential input unit;
    a second NMOS transistor to have a source connected to the ground voltage, and a gate to which the second bias voltage is applied;
    a third NMOS transistor to have a source connected to the ground voltage, and a gate to which the second bias voltage is applied;
    a fourth NMOS transistor to have a source connected to the ground voltage, and a gate to which the second bias voltage is applied;
    a first switch to be coupled between a drain of the second NMOS transistor and the N-type differential input unit, and turned on or off in response to the bias current control signal;
    a second switch to be coupled between a drain of the third NMOS transistor and the N-type differential input unit, and turned on or off in response to a first bit of a gray code; and
    a third switch to be coupled between a drain of the fourth NMOS transistor and the N-type differential input unit, and turned on or off in response to a second bit of the gray code.

22. The circuit as claimed in claim 21, wherein a size of the second NMOS transistor is about half of that of the first NMOS transistor, a size of the third NMOS transistor is about one fourth of that of the first NMOS transistor, and a size of the fourth NMOS transistor is about one eighth of that of the first NMOS transistor.

23. A source driving circuit of a display device, comprising:
    a shift register to generate a pulse signal based on a clock signal and an input/output control signal;
    a data latch circuit to latch data according to a shift sequence of the shift register and output the data as digital input signals in response to a load signal; and
    a digital-to-analog converting circuit to generate input voltage signals corresponding to the digital input signals using a gray voltage; and an output buffer circuit to buffer the input voltage signals to generate source signals, the output buffer circuit comprising:
a bias current control signal generating circuit to include a reference operational amplifier, the bias current control signal generating circuit to perform an exclusive OR operation on an input signal and an output signal of the reference operational amplifier to generate a bias current control signal; and
a channel amplifying circuit to adjust a slew rate of a plurality of output voltage signals in response to the bias current control signal, the channel amplifying circuit to perform buffering on a plurality of input voltage signals to generate the plurality of output voltage signals.

24. A method of operating a source driving circuit of a display device, the method comprising:
generating a pulse signal based on a clock signal and an input/output control signal using a shift register;
latching data according to a shift sequence of the shift register and outputting the data as digital input signals in response to a load signal;
generating input voltage signals corresponding to the digital input signals using a gray voltage;
performing an exclusive OR operation on an input signal and an output signal of a reference operational amplifier to generate a bias current control signal; and
adjusting a slew rate of a plurality of source signals in response to the bias current control signal, and performing buffering on the input voltage signals to generate the plurality of source signals.

25. The method according as claimed in claim 24, further comprising:
adjusting the slew rate of the plurality of source signals based on a gray code of the source driving circuit.

* * * * *